United States Patent
Cairns et al.

[11] Patent Number: 6,154,121
[45] Date of Patent: Nov. 28, 2000

[54] NON-LINEAR DIGITAL-TO-ANALOG CONVERTER AND DISPLAY INCORPORATING THE SAME

[75] Inventors: Graham Andrew Cairns, Cutteslowe; Michael James Brownlow, Sanford on Thames, both of United Kingdom

[73] Assignee: Sharp Kabushiki Kaisha, Osaka, Japan

[21] Appl. No.: 09/229,458

[22] Filed: Jan. 12, 1999

[30] Foreign Application Priority Data

Jan. 17, 1998 [GB] United Kingdom ............ 9800943

[51] Int. Cl.[7] .................. H03K 13/02; H03M 1/18
[52] U.S. Cl. .......... 340/347; 341/138; 341/144; 341/150; 341/118; 341/139
[58] Field of Search ................ 341/138, 139, 341/118, 144, 150, 347

[56] References Cited

U.S. PATENT DOCUMENTS

| | | | |
|---|---|---|---|
| 3,997,892 | 12/1976 | Susset | 340/347 |
| 4,503,421 | 3/1985 | Hareyama | 340/347 |
| 5,270,715 | 12/1993 | Kano | 341/139 |

OTHER PUBLICATIONS

Search Report for GB Application No. 9800943.4; Dated Mar. 20, 1998.

*Primary Examiner*—Brian Young
*Assistant Examiner*—John Nguyen
*Attorney, Agent, or Firm*—Renner, Otto, Boisselle & Sklar, LLP

[57] ABSTRACT

A non-linear digital-to-analog converter includes: a k bit parallel input; a decoding circuit having M inputs connected to M most significant bits of the parallel input, the decoding circuit being arranged to connect first and second consecutive reference inputs among $2^m+1$ reference inputs to first and second outputs, respectively, where M>m; and a variable resolution linear digital-to-analog converter having first and second reference inputs connected to the first and second outputs of the decoding circuit, respectively, and further having N digital inputs connected to N least significant bits of the parallel input, where (M+N)>k.

12 Claims, 14 Drawing Sheets

Linear element end-points at 0, 4, 8, 12, and 16

Linear element end-points at 0, 3, 7, 11, and 16

NON-LINEAR DIGITAL-TO-ANALOG CONVERTER AND DISPLAY INCORPORATING THE SAME

The present invention relates to a non-linear digital-to-analog converter and to a display. Such a converter may be used to implement an arbitrary non-linear function during conversion from the digital domain to the analog domain. An example where such a technique may be used is in digitally interfaced displays, such as active matrix liquid crystal devices (AMLCDs) in which an analog voltage for controlling the optical attenuation of each picture element (pixel) is generated from digital pixel data and compensation for the non-linearity of optical attenuation versus pixel voltage (gamma correction) is provided.

Two stage digital-to-analog converters are known, for instance from Horowitz et al, "The Art of Electronics", Cambridge University Press, 1988. Such converters may be used to implement a piecewise linear approximation to an arbitrary non-linear function, for instance as suggested by Grzybowski et al, "Non-Linear Functions from d.a. Converters", Electronic Engineering, July 1971, pp 48–51. Examples of converters of this type are disclosed in U.S. Pat. No. 5,191,333 and U.S. Pat. No. 3,997,892 and FIG. 1 of the accompanying drawings illustrates such a converter. The converter comprises a store 1, for instance in the form of a k bit latch for a k bit converter. The latch has k inputs connected to receive a parallel digital input vd(0:k−1). The store is partitioned into m most significant bits (MSBs) and n least significant bits (LSBs) such that m+n=k.

The converter comprises a first digital-to-analog (D/A) stage 2 and a second D/A stage 3. The first stage 2 has an m bit parallel input connected to receive the m MSBs from the store 1 and a reference input for receiving $2^m+1$ reference voltages vr(0:$2^m$). The first stage 2 comprises an m bit to $2^m$ line decoder 2a having $2^m$ outputs connected to a reference selector 2b. The reference selector 2b has outputs for supplying a lower bound or limit voltage vl and an upper bound or limit voltage vh to the second stage 3.

The second stage 3 comprises a linear D/A converter having n inputs connected to the n LSBs of the store 1. The second stage 3 performs a linear D/A conversion in the range defined by the upper and lower limit voltages vh and vl using the n LSBs.

The m MSBs select which of the reference voltages vr(0:$2^m$) are supplied as the limit voltages vh and vl. By selecting appropriate values for the reference voltages, it is possible for the converter to perform non-linear conversion using a piecewise linear approximation of $2^m$ linear line segments or elements.

A converter of this type may be used to provide gamma correction in digitally interfaced AMLCDs. FIG. 2 is a graph illustrating transmission through a liquid crystal pixel in per cent against the voltage applied across the pixel and represents a typical transfer function. The transfer function is non-linear and requires compensation in order for digital data representing grey scale to control pixel transmission linearly. Such compensation may be provided by applying the inverse transfer function to that illustrated in FIG. 2 and may be performed by a converter of the two stage type.

FIG. 3 of the accompanying drawings illustrates the inverse function by the broken line curve as voltage against digital pixel data for a 6 bit digital input vd(0:5). FIG. 3 also illustrates a piecewise approximation to the inverse function provided by a converter of the type shown in FIG. 1 in which k=6, m=3 and n=3. Thus, the decoder 2a is a 3 bit to 8 line decoder and controls the reference selector 2b to select which two of the nine gamma correction reference voltages vr(0:8) are supplied to the second stage 3. The three LSBs are used to perform a linear D/A conversion within the limits vl and vh selected by the selector 2b.

The piecewise linear approximation is illustrated by the unbroken curve in FIG. 3. Because a fixed number m of bits is always used in the first stage 2, the widths of the individual linear segments or elements (in the input domain) are the same. This results in a relatively poor approximation to the desired function which is more apparent in regions where the absolute value of the second derivative of the function is higher, ie: where the function is less linear. Such inaccuracy is illustrated at 4 in FIG. 3.

Cantoni, "Optimal Curve Fitting with Piecewise Linear Functions", IEEE Transactions on Computers, 1971, 20(1), pages 59–67 discloses a technique for providing optimal curve fitting for a given number of piecewise linear elements. This results in an approximation in which the linear element end-points are positioned at calculated locations in the input space. However, this solution is inconvenient for two-stage D/A converters in which it is preferable for the end-points to be positioned such that they are separated by a power of 2 bits in the input space and further, within the input range of each linear element, the number of LSBs which change state is the minimum possible. The reason for this is the need for simplicity in the second D/A stage.

FIGS. 4(a) and 4(b) illustrate this issue in more detail for a two-stage converter in which k=4, m=2 and n=2. In each of these drawings, an arbitrary non-linear function is represented by a broken line curve and a curve in unbroken lines represents a four linear element approximation. The approximation shown in FIG. 4(a) is of the type provided by the two-stage converter described hereinbefore in which the four linear elements are of equal width and each corresponds to 2 bits in the input domain. The positioning of the end-points ensures that only two LSBs change within the input space for each of the linear elements 10, 11, 12 and 13. For example, for the linear element 11, the inputs are 0100, 0101, 0110 and 0111. It is convenient to use the 2 LSBs for the linear conversion in the second stage because they represent values incrementing from 0 (00) to full scale (11) for a 2 bit D/A converter. Further, because this is the case for all of the linear elements, the upper bound end-point vh of one element is the same as the lower bound end-point vl of the next linear element. Only five reference voltages are required, ie: one more than the number of linear elements.

FIG. 4(b) illustrates a four linear element approximation with the linear element end-points located at different positions so as to provide a better approximation to the desired non-linear function. Two of the linear elements demonstrate the additional complexity of the second D/A stage caused by the end-point positioning.

For linear element 10, the end-points are separated by 3 bits in input space; this separation is not equal to a power of 2 as would be most convenient. To achieve the required conversion, a two bit second D/A stage is required operating between reference voltages vl0 and vh0. The upper bound reference voltage vh0 is not coincident with the lower bound reference vl1 of the next linear element. Extra reference voltages are therefore required.

For linear element 11, the inputs are 0011, 0100, 0101 and 0110. Although the end-points are separated by a power of 2 bits, three LSBs change over the range of the linear element and this is greater than the minimum possible, which is two for a 4 bit wide linear element.

A first solution to this problem is to provide a 3 bit linear D/A converter operating between the references vl1 and vh1.

However, these references do not coincide with the references of the adjacent linear elements so that the total number of references has to be increased. If this solution is adopted for all of the linear elements, a total of eight references is required as shown in FIG. 4(b).

A second solution to this problem involves bit manipulation. If 0011 is subtracted from the input bits, then a 2 bit D/A converter operating between references vl1' and vh1' is required. This solution allows the number of references to be kept to a minimum but requires complex bit manipulation circuitry.

According to a first aspect of the invention, there is provided a non-linear digital-to-analog converter comprising a k bit parallel input, characterised by: a decoding circuit having M inputs connected to the M most significant bits of the parallel input and being arranged to connect first and second consecutive ones of ($2^m$+1) reference inputs to first and second outputs, respectively, where M>m; and a variable resolution linear digital-to-analog converter having first and second reference inputs connected to the first and second decoding circuit outputs, respectively, and N digital inputs connected to the N least significant bits of the parallel input, where (M+N)>k.

(M+N) may be greater than (k+1).

The decoding circuit may comprise a fixed M bit to $2^m$ line decoder.

The decoding circuit may comprise a programmable M bit to $2^m$ line decoder.

The decoding circuit may comprise a reference input selector. The reference input selector may comprise first and second selectors for connecting ith and (i+1)th reference inputs to the first and second decoding circuit outputs, respectively, where $0 \leq i < 2^m$.

The variable resolution converter may comprise a fixed resolution N bit converter and a least significant bit shifter controlled by the decoding circuit. As an alternative, the variable resolution converter may comprise a fixed resolution N bit converter and a bit manipulator. The fixed resolution converter may comprise a charge-sharing digital-to-analog converter.

The parallel input may comprise a latch.

According to a second aspect of the invention, there is provided a display characterised by comprising a data driver including at least one converter according to the first aspect of the invention.

It is thus possible to provide a non-linear D/A converter which is capable of performing digital-to-analog conversion while implementing a non-linear function with improved accuracy compared with, for example, converters of the type shown in FIG. 1 of the accompanying drawings. In particular, it is possible to provide a piecewise linear element approximation which is a closer approximation to a desired arbitrary non-linear function without requiring more reference values than for the converter shown in FIG. 1 of the accompanying drawings.

The improved accuracy is provided by the more efficient use of data bits because the resolutions of the conversions performed in the two stages can be made dependent on the value of the input signal. Thus, the widths of the linear elements referred to the input domain may be different and correspondingly the resolution of conversion performed within each pair of linear element end-points may be different. The more efficient use of data bits allows the accuracy to be improved by using more bits and reference voltages in the decoding circuit where the function to be approximated is less linear and by using fewer bits and fewer reference voltages in the decoding circuit where the function to be approximated is more linear. Thus, more accurate piecewise linear approximations may be performed using the same number of bits and the same number of voltage references as in known arrangements.

The invention will be further described by way of example, with reference to the accompanying drawings in which.

Like reference numbers refer to like parts throughout the drawings.

Figure 5:
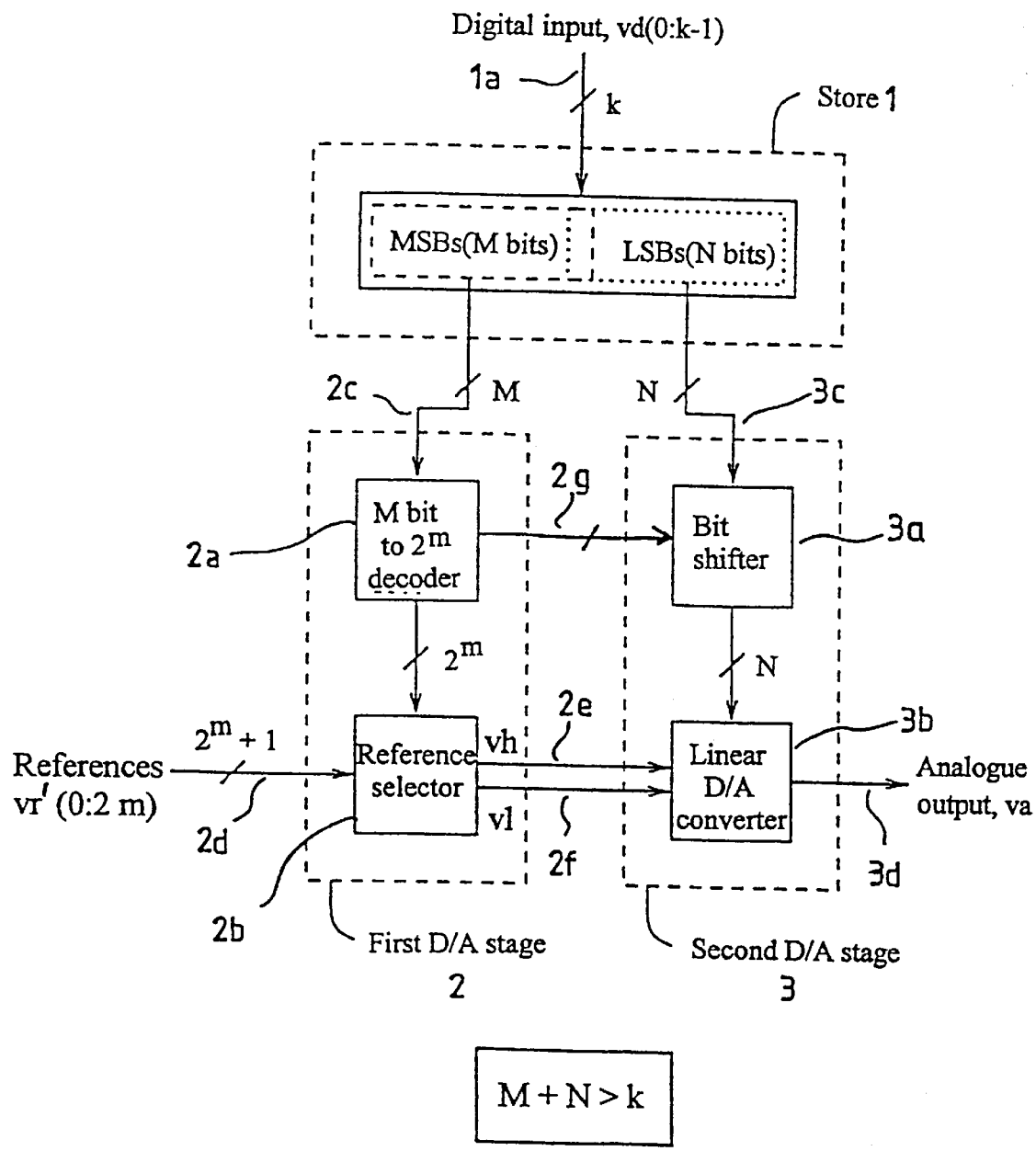
FIG. 5 is a block schematic diagram of a two-stage multi-resolution non-linear D/A converter constituting a first embodiment of the invention.

The non-linear D/A converter shown in FIG. 5 converts k bit digital input words vd(0:k−1) into an analog output voltage va in accordance with a predetermined non-linear transfer function. The converter has an input in the form of a store 1, such as a k bit parallel latch, whose parallel inputs 1a receive the digital input.

The converter comprises a first D/A stage 2 and a second D/A stage 3. The first stage 2 comprises an M bit to $2^m$ line decoder 2a whose $2^m$ outputs are connected to a reference selector 2b. The decoder 2a has M parallel inputs 2c connected to the outputs of the M most significant bits (MSBs) of the store 1.

The reference selector 2b has ($2^m$+1) inputs 2d which receive reference voltages vr'(0:$2^m$). The reference selector 2b has first and second outputs 2e and 2f and comprises first and second selectors controlled by the $2^m$ outputs of the decoder $2a$ so as to select which of the reference voltages are supplied to the outputs $2e$ and $2f$. The selectors are controlled such that "consecutive" references are supplied to the outputs $2e$ and $2f$, ie: when the output $2f$ supplies a value vl equal to vr'(i), the output $2e$ supplies a value vh equal to vr'(i+1), where $0 \leq i < 2^m$. The values vl and vh represent the end points of linear elements of a piecewise linear approximation to the desired non-linear function such that the upper end point vh of each linear element coincides with the lower end point vl of the next linear element.

The second stage 3 is a variable resolution linear digital-to-analog converter and comprises a bit shifter $3a$ having N parallel inputs $3c$ connected to the N least significant bits (LSBs) of the store 1. The N outputs of the bit shifter $3a$ are connected to the N parallel inputs of a fixed resolution linear N bit D/A converter $3b$ whose output $3d$ comprises the output of the non-linear converter. The linear converter $3b$ has first and second reference inputs connected to the first and second outputs $2e$ and $2f$ of the first stage 2. The bit shifter $3a$ has a bit shifting control input connected to an output $2g$ of the decoder $2a$ for controlling bit shifting by the shifter $3a$ as described hereinafter.

Figure 1:
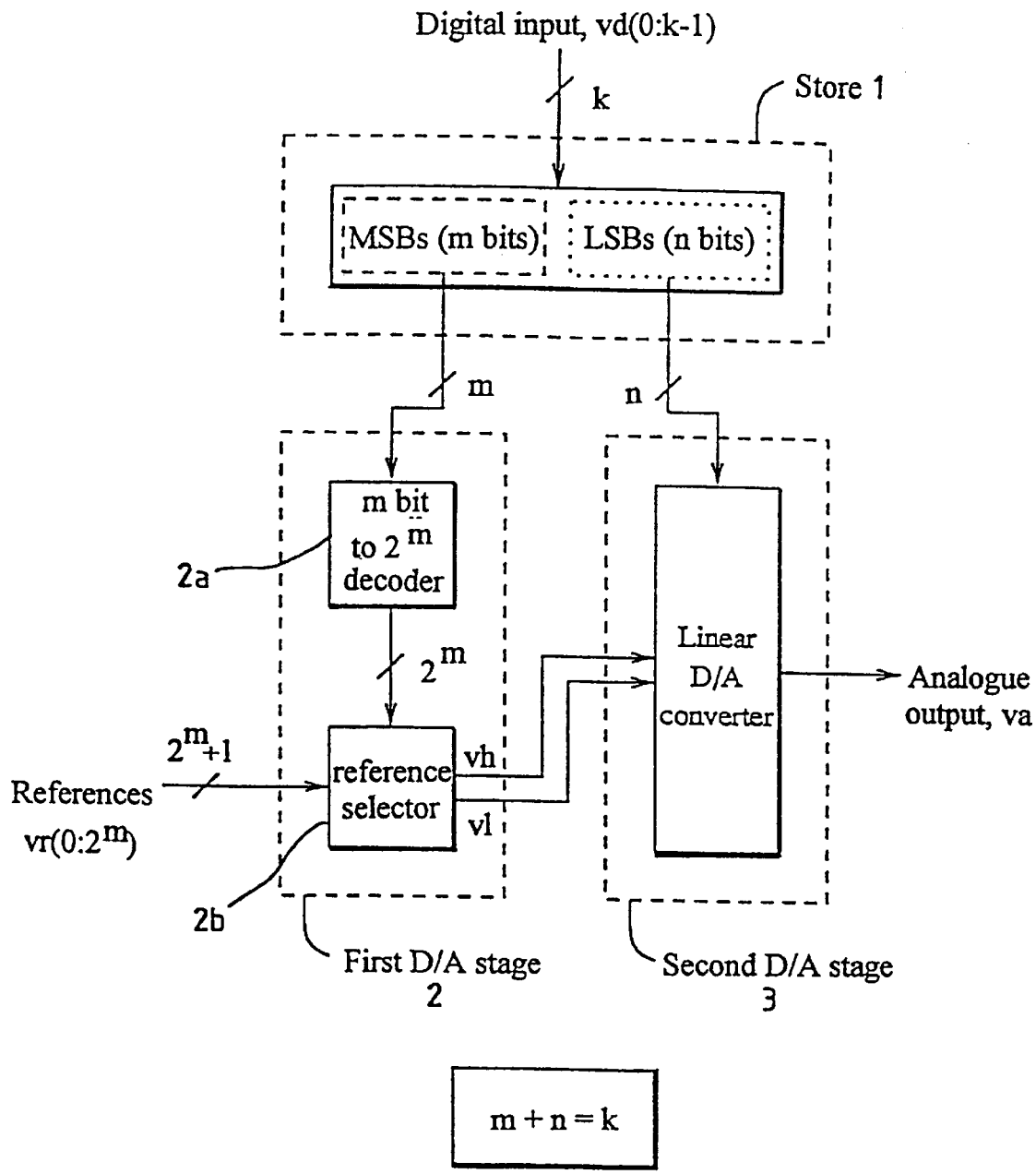
FIG. 1 is a block schematic diagram of a known type of two-stage D/A converter for performing non-linear conversions.
Figure 2:
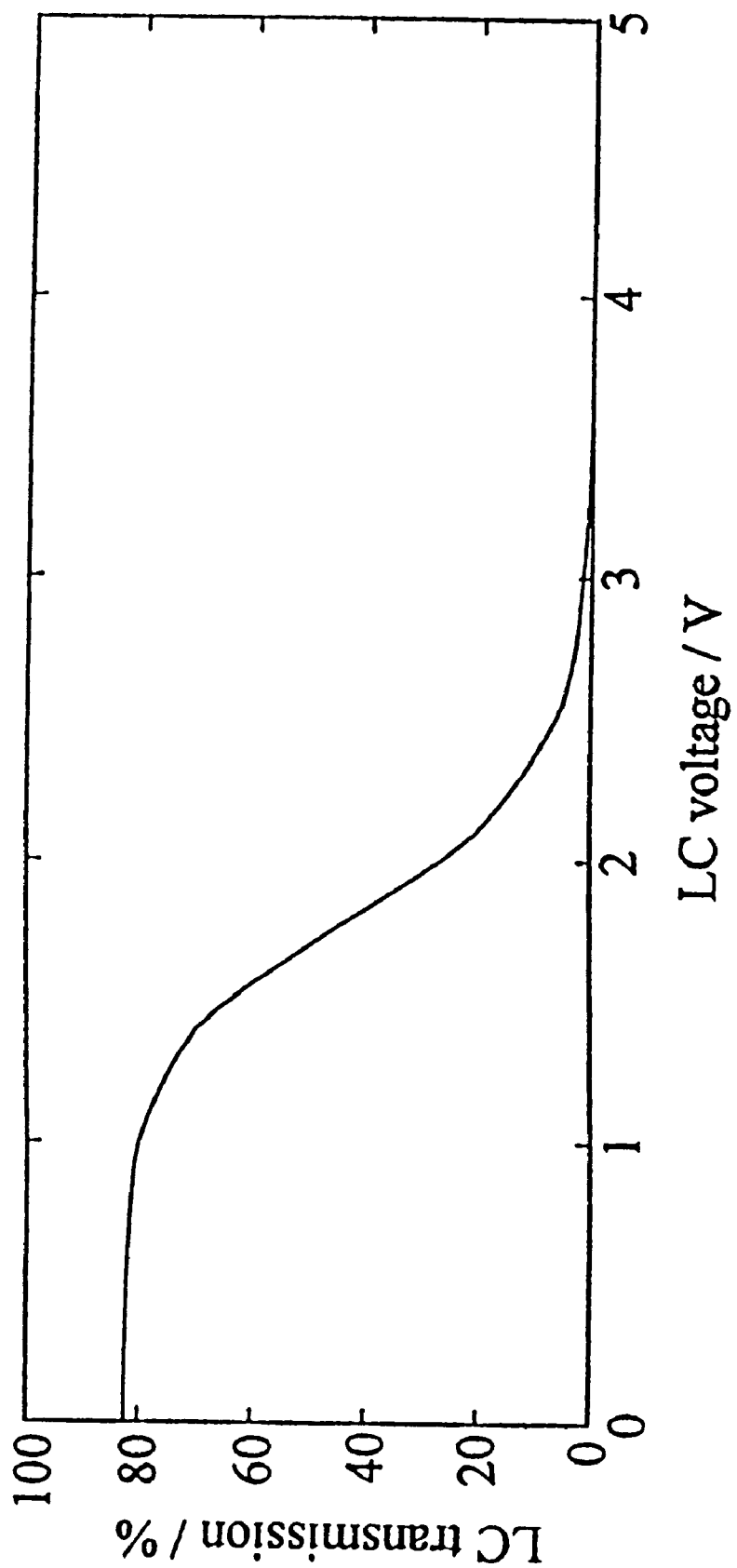
FIG. 2 is a graph of transmission in per cent against applied voltage for a typical liquid crystal display cell.

The converter shown in FIG. 5 thus comprises a two stage converter of a type similar to that shown in FIG. 1. The parameter m of the converter shown in FIG. 5 is equivalent to that of the converter shown in FIG. 1 insofar as this parameter determines the number of references vr'(0:$2^m$). However, whereas the decoder $2a$ of the converter shown in FIG. 1 is an m bit to $2^m$ line decoder, the decoder $2a$ of the converter shown in FIG. 5 is a M bit to $2^m$ line decoder, where M>m.

The second stage 3 of the converter shown in FIG. 1 is a fixed resolution n bit linear D/A converter. The second stage 3 of the converter shown in FIG. 5 is a variable resolution converter including the N bit fixed resolution converter $3b$, where $N \geq n$. Thus, whereas (m+n)=k for the converter of FIG. 1, (M+N)>k for the converter of FIG. 5. Whereas each digital input word is partitioned into separate groups of m and n bits, which groups are supplied independently to the first and second stages 2 and 3 in the converter of FIG. 1, there is no equivalent partitioning in the converter of FIG. 5. Instead, one or more of the "intermediate" significant bits from the input are supplied to both the first stage 2 and the second stage 3.

Figure 6:
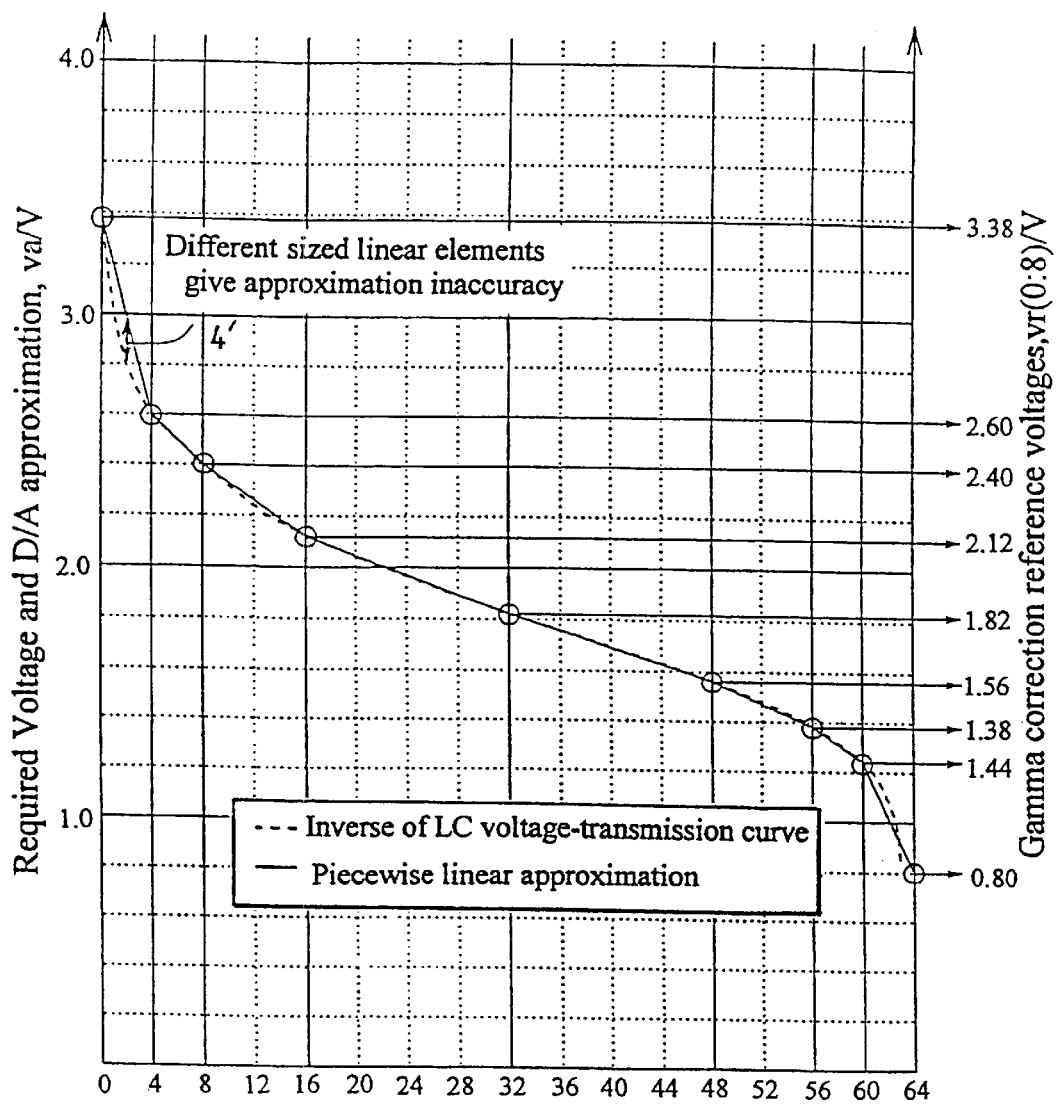
FIG. 6 is a graph illustrating the inverse function shown in FIG. 3 and a piecewise approximation with variable piecewise linear element ranges provided by the converter of FIG. 5.

The decoder $2a$ is arranged in accordance with the non-linear function to decode the M MSBs of the digital input in such a way that different numbers of the MSBs are used to specify the references selected by the selector $2b$ for different input ranges. As shown in FIG. 6, this results in the piecewise approximation to the non-linear function being in the form of linear elements whose widths in the input domain (ie: parallel to the horizontal axis) vary throughout the input range. The piecewise approximation illustrated by the unbroken line in FIG. 6 to the non-linear function illustrated by the broken line is achieved by the converter shown in FIG. 5 for k=6, m=3, M=4 and N=4. In the input range 0 to 4, the four MSBs are used to select reference voltages 3.38 and 2.60 as the values vh and vl, respectively. The remaining two LSBs are then used by the converter $3b$ to perform a linear D/A conversion between these end-point values. Similarly, for the input range 4 to 8, the four MSBs are used to select the reference voltages 2.40 and 2.60 as the values vl and vh, respectively, and the remaining two bits are used by the converter $3b$ to perform the linear conversion between these values.

For the range 8 to 16, the three MSBs are used to select the reference voltages 2.12 and 2.40 and the remaining three LSBs are used for the linear D/A conversion between these values. For the digital input range 16 to 32, the two MSBs are used to select the reference voltages 1.82 and 2.12 as the values vl and vh, respectively, and the remaining four LSBs are used for the linear D/A conversion between these values.

The output $2g$ of the decoder $2a$ is used to determine the bit shifting by the shifter $3a$ so as to ensure that the bits currently being used for the linear conversion by the converter $3b$ are received by the converter $3b$ as the most significant bits. Thus, conversions of lower resolution than the N bits of which the converter $3b$ is capable are performed by shifting the LSBs such that the most significant bit of the LSBs is supplied to the N bit converter $3b$ as the MSB. For example, a conversion of (k−M) bit resolution involves a bit shift by the shifter $3a$ of (N+M−k) bits.

Figure 3:
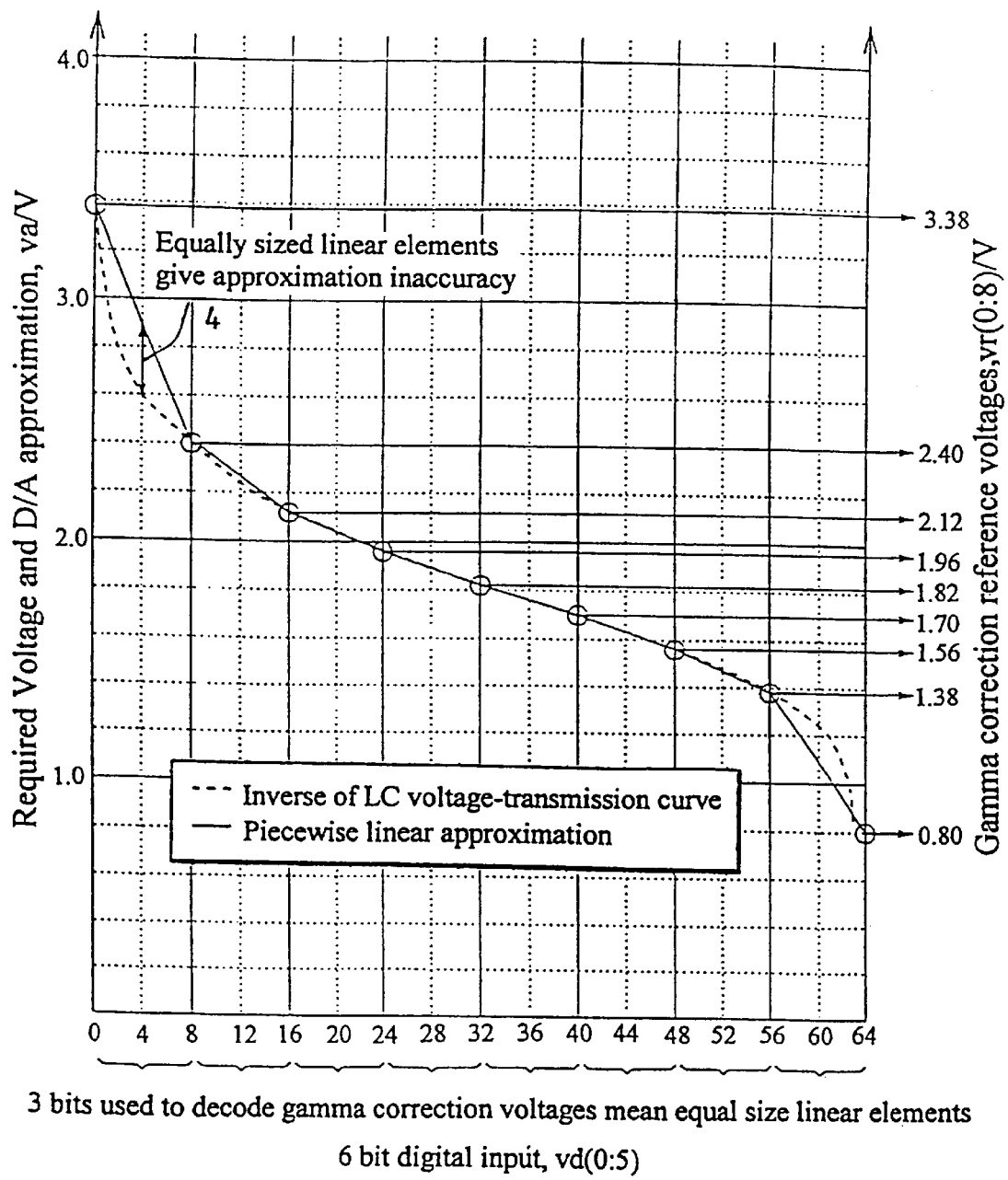
FIG. 3 is a graph illustrating the inverse of the function shown in FIG. 2 and a fixed piecewise linear element approximation provided by a constant resolution D/A converter of the type shown in FIG. 1.

The decoding performed by the decoder $2a$ is such that different numbers of bits between M and (k−N) can be used in different ranges of input values to select the reference voltages and hence the end-points of the linear elements. This determines the number of bits between (k−M) and (N) which are used in the linear conversion performed by the converter $3b$. This allows the piecewise linear approximation to approach more closely the desired non-linear transfer function of the converter. In particular, the accuracy of the approximation can be improved by using more bits in the first stage 2 and hence less bits in the second stage 3 in more non-linear regions of the function (the digital input ranges 0 to 8 and 56 to 64 in FIG. 6) whereas less bits are used in the first stage 2 and hence more bits are used in the second stage 3 for more linear regions of the function, such as in the input range 16 to 48 as shown in FIG. 6. The improvement in approximation accuracy is illustrated at 4' in FIG. 6 as compared with the inaccuracy 4 shown in FIG. 3 for the known converter shown in FIG. 1. Although the converter of FIG. 1 and the converter of FIG. 5 achieve good approximations in the more linear regions of the non-linear transfer function, the converter of FIG. 5 achieves a substantial improvement in accuracy compared with the converter of FIG. 1 in the more non-linear regions. The approximation to the non-linear function is therefore substantially improved without requiring a higher resolution digital input (ie: more bits) and without requiring further references; the converters of FIGS. 1 and 5 use the same number of references vr(0:$2^m$) and vr'(0:$2^m$). When the converters of FIGS. 1 and 5 are used as column digital data drivers of liquid crystal devices, the reference voltages provide gamma correction as described hereinbefore. Comparing the gamma correction reference voltages in FIGS. 3 and 6, those for the converter of FIG. 5 are more evenly spaced in the output domain than those for the converter of FIG. 1. Although the converter of FIG. 5 requires additional circuitry compared with the converter of FIG. 1, this is far outweighed by the improvement in accuracy of the approximation to the non-linear function without requiring additional reference voltages.

Figure 7:
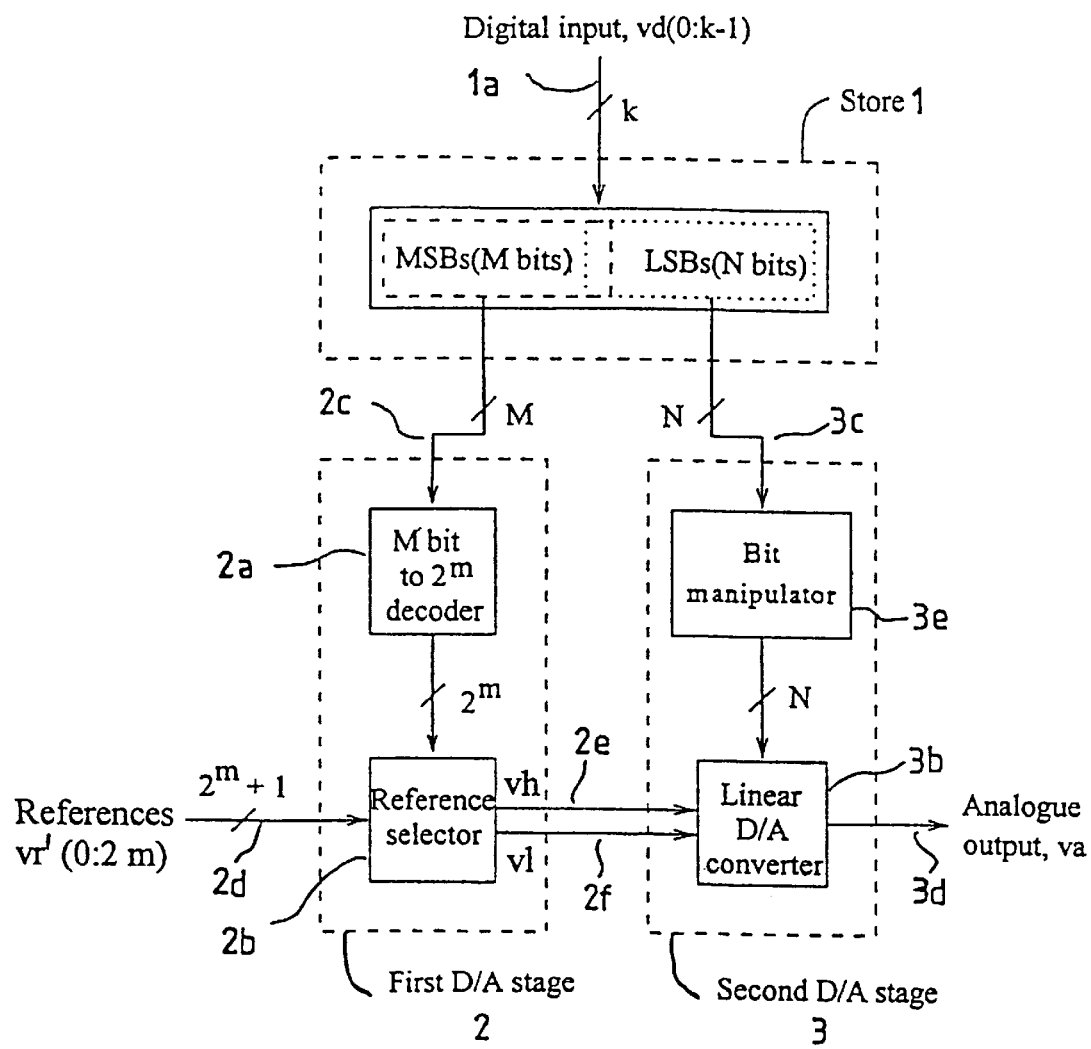
FIG. 7 is a block schematic diagram of a two-stage multi-resolution non-linear D/A converter constituting a second embodiment of the invention.

The converter shown in FIG. 7 differs from that shown in FIG. 5 in that the bit shifter $3a$ is replaced by a bit manipulator $3e$. The bit manipulator $3e$ is arranged to add/subtract bits to/from the input so as to relax the constraint that the number of bits which change state within each linear element is the minimum possible for a given linear element width. Otherwise, the converter shown in FIG. 7 operates in the same way as the converter shown in FIG. 5 and, in particular, uses the same number of references.

Figure 8:
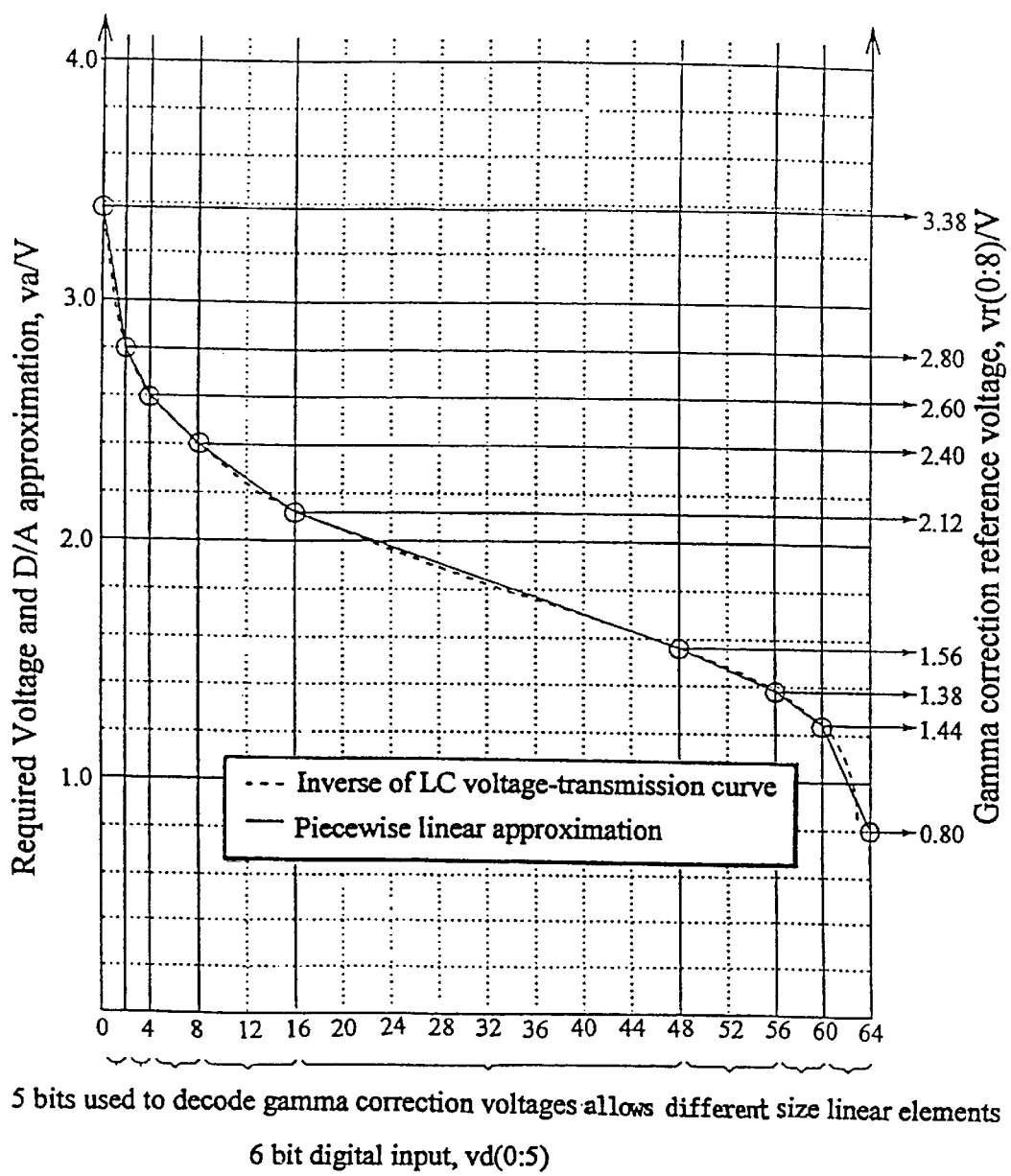
FIG. 8 is a graph similar to that of FIG. 6, but illustrates a different piecewise approximation which may be provided by the converter of FIG. 7.

FIG. 8 illustrates the performance of the converter of FIG. 7 where k=6, m=3, M=5 and N=5. Although this requires additional circuitry in the decoder $2a$ and a 5 bit linear D/A converter 3b as opposed to the 4 bit converter for the parameters of FIG. 6, a further improvement in the accuracy of the approximation of the non-linear transfer function is achieved for a six bit non-linear converter again using nine gamma correction voltages.

Figure 9:
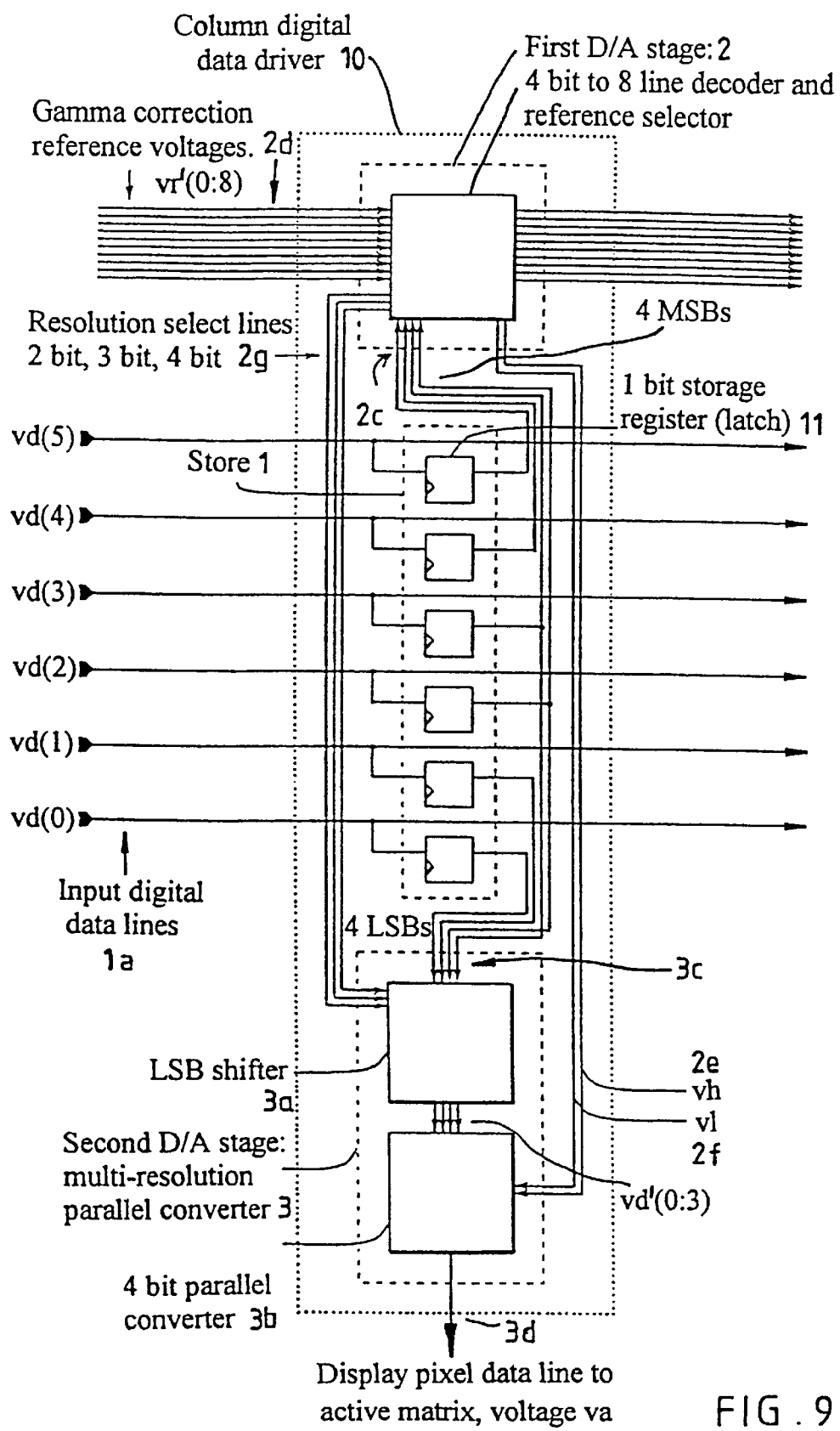
FIG. 9 is a block circuit diagram of an example of the converter of FIG. 5 for six bit input data.

FIG. 9 illustrates an application of the converter shown in FIG. 5 to a column digital data driver 10 of an active matrix liquid crystal device (AMLCD) for performing D/A conversion and gamma correction to correct for the non-linear liquid crystal voltage-optical transmission transfer function. The parameters for the embodiment shown are k=6, m=3, M=4 and N=4. Each column of pixels is provided with a driver 10. The six bit input digital data lines 1a are common to all of the drivers as are the gamma correction voltages at the inputs 2d. The store 1 is shown as six one bit storage registers or latches 11. Control circuits (not shown) control the timing of operation of the driver. In particular, a clock signal is supplied at the appropriate instant to cause the latches 11 of the store 1 to sample and hold the input data on the input digital data lines 1a. The four MSBs are supplied to the input 2c of the first D/A stage 2, which contains a 4 bit to 8 line decoder for selecting the values vh and vl from the nine gamma correction reference voltages vr'(0:8). The digital input value stored in the store 1 determines whether the 4 bit parallel converter 3b performs a 2, 3 or 4 bit linear D/A conversion according to the signals on the resolution select lines 2g. The piecewise linear approximation to the desired non-linear transfer function is determined by the decoding logic in the decoder 2a and the gamma correction reference voltages supplied to the inputs 2d.

Figure 10:
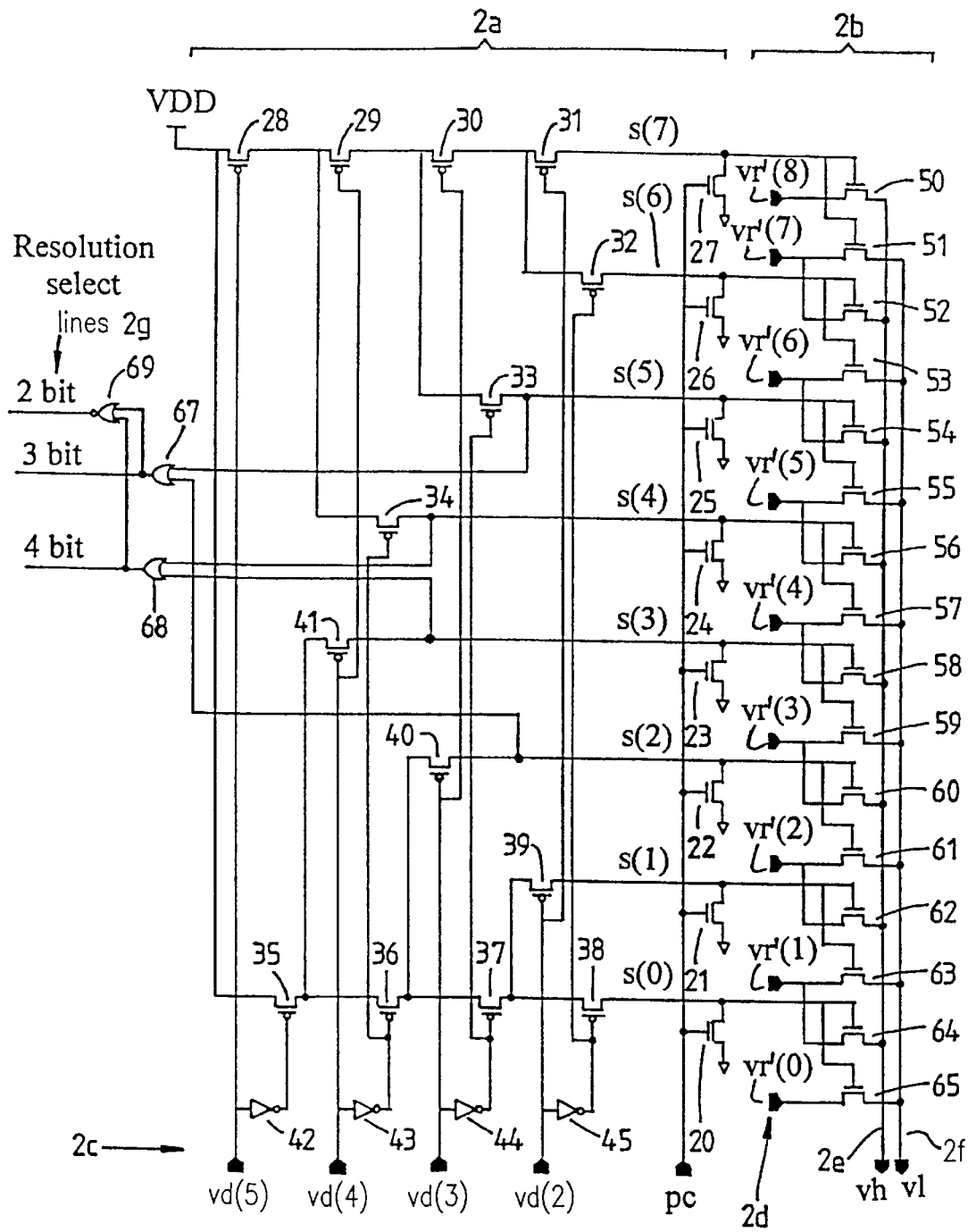
FIG. 10 is a circuit diagram illustrating a decoder of the converter of FIG. 9.

FIG. 10 shows in more detail the decoder 2a and the selector 2b. The decoder 2a is a 4 bit to 8 line decoder embodied as a precharge-evaluate tree structure. The decoder 2a comprises nodes s(0) to s(7) at which the control signals for the reference selector 2b are formed. The nodes s(0) to s(7) are connectable via N-type metal oxide silicon field effect transistors (MOSFETs) 20 to 27, respectively, to ground under control of a pre-clock signal pc supplied to the gates of the transistors 20 to 27. The nodes s(0) to s(7) are connectable via a fixed decoding arrangement to a power supply line VDD. The decoding arrangement is controlled by the four MSBs supplied to the input 2c.

The node s(7) is connected to the supply line VDD via series-connected P-type transistors 28 to 31. The node s(6) is connected via a P-type transistor 32 to the connection between the transistors 30 and 31. The node s(5) is connected via a P-type transistor 33 to the connection between the transistors 29 and 30. The node s(4) is connected via a P-type transistor 34 to the connection between the transistors 28 and 29.

The node s(0) is connected via series-connected P-type transistors 35 to 38 to the supply line VDD. The node s(1) is connected via a P-type transistor 39 to the connection between the transistors 37 and 38. The node s(2) is connected via a P-type transistor 40 to the connection between the transistors 36 and 37. The node s(3) is connected via a P-transistor 41 to the connection between the transistors 35 and 36.

The gates of the transistors 28 to 31 are connected to the bit lines vd(5) to vd(2), respectively, of the input 2c. The gates of the transistors 35 to 38 are connected via inverters 42 to 45 to the bit lines vd(5) to vd(2), respectively. The gate of the transistor 32 is connected to the output of the inverter 45. The gate of the transistor 33 is connected to the output of the inverter 44. The gate of the transistor 34 is connected to the output of the inverter 43. The gate of the transistor 39 is connected to the bit line vd(2). The gate of the transistor 40 is connected to the bit line vd(3). The gate of the transistor 41 is connected to the bit line vd(4).

The reference selector 2b comprises N-type transistors 50 to 65. The gates of the transistors 50 and 51 are connected to the node s(7). The gates of the transistors 52 and 53 are connected to the node s(6). The gates of the transistors 54 and 55 are connected to the node s(5). The gates of the transistors 56 and 57 are connected to the node s(4). The gates of the transistors 58 and 59 are connected to the node s(3). The gates of the transistors 60 and 61 are connected to the node s(2). The gates of the transistors 62 and 63 are connected to the node s(1). The gates of the transistors 64 and 65 are connected to the node s(0).

The sources of the transistors 50, 52, 54, 56, 58, 60, 62 and 64 are connected together and to the output 2e. The sources of the transistors 51, 53, 55, 57, 59, 61, 63 and 65 are connected together and to the output 2f. The drain of the transistor 50 is connected to the reference line vr'(8). The drains of the transistors 51 and 52 are connected to the reference line vr'(7). The drains of the transistors 53 and 54 are connected to the reference line vr'(6). The drains of the transistors 55 and 56 are connected to the reference line vr'(5). The drains of the transistors 57 and 58 are connected to the reference line vr'(4). The drains of the transistors 59 and 60 are connected to the reference line vr'(3). The drains of the transistors 61 and 62 are connected to the reference line vr'(2). The drains of the transistors 63 and 64 are connected to the reference line vr'(1). The drain of the transistor 65 is connected to the reference line vr'(0).

The transistors 50, 52, 54, 56, 58, 60, 62 and 64 act as a first selecting circuit for selecting which of the reference voltages is supplied as vh to the output 2e. Similarly, the transistors 51, 53, 55, 57, 59, 61, 63 and 65 act as a second selecting circuit for selecting which of the reference voltages is supplied as vl to the output 2f.

The decoder 2a further comprises OR gates 67 and 68 and a NOR gate 69. The gate 67 has inputs connected to the nodes s(2) and s(S). The gate 68 has inputs connected to the nodes s(3) and s(4). The gate 69 has inputs connected to the outputs of the gates 67 and 68. The outputs of the gates 68, 67 and 69 are connected to the 4 bit, 3 bit and 2 bit resolution select lines 2g for controlling the bit shifter 3a.

When a D/A conversion is to be performed, the signal pc causes the transistors 20 to 27 to discharge the nodes s(0) to s(7). The four MSBs are supplied to the input 2c and control the transistors 28 to 41 such that one and only one of the nodes is charged from the supply line VDD. The charged node is connected to two of the transistors 50 to 65, which become conductive and pass consecutive ones of the reference voltages to the outputs 2e and 2f.

When one of the nodes s(3) and s(4) is charged, the gate 68 produces an output indicating that a 4 bit resolution conversion is to be performed by the converter 3b. When one of the nodes s(2) and s(5) is charged, the output of the gate 67 supplies a signal indicating that a 3 bit resolution conversion is to be performed by the converter 3b. When any of the other nodes is charged, the outputs of the gates 67 and 68 are low so that the gate 69 provides a signal indicating that a 2 bit resolution conversion is to be performed by the converter 3b.

Figure 11:
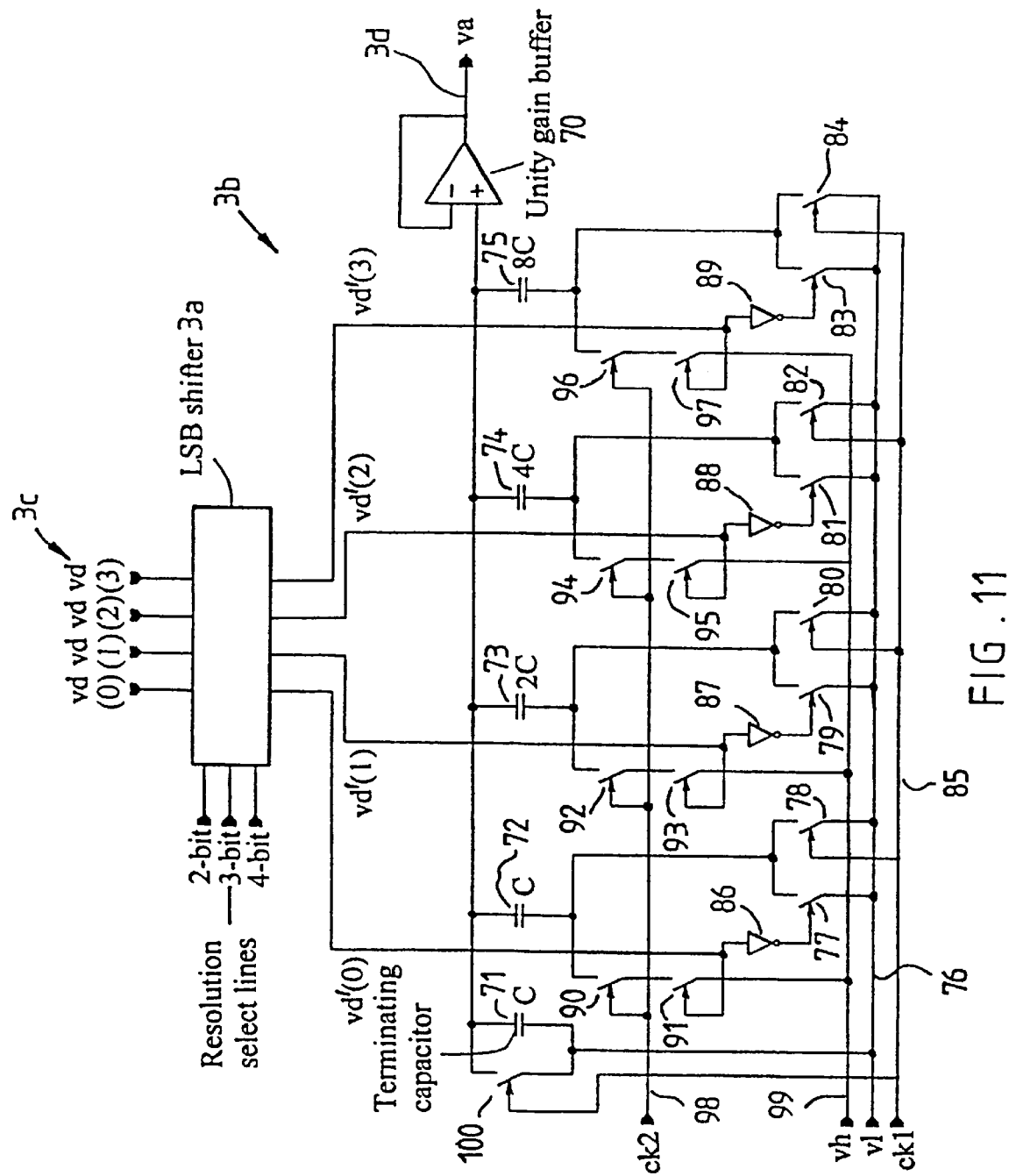
FIG. 11 is a circuit diagram of a multi-resolution parallel linear D/A converter of the converter of FIG. 9.

FIG. 11 shows the fixed resolution linear D/A converter 3b in more detail. The converter is of the parallel charge-sharing type and comprises a unity gain buffer 70 whose output forms the output 3d of the converter and whose input is connected to a first terminal of capacitors 71 to 75. The other terminal of the capacitor 71 is connected to a reference line 76 for receiving the value vl. The second terminals of the capacitors 72 to 75 are connectable to the reference line 76 via pairs of switches 77 and 78, 79 and 80, 81 and 82, 83 and 84, respectively. The switches 78, 80, 82 and 84 are connected to a control line 85 for receiving a first clock signal ck1.

The switches 77, 79, 81 and 83 are connected to the outputs of the shifter 3a via inverters 86, 87, 88 and 89, respectively.

The second terminals of the capacitors 72 to 74 are connected via series-connected pairs of switches 90 and 91, 92 and 93, 94 and 95, 96 and 97, respectively, to a reference line 99 for the value vh.

The switches 90, 92, 94 and 96 are connected to a control line 98 for receiving a second clock signal ck2. The switches 91, 93, 95 and 97 are controlled by respective outputs of the shifter 3a. The input of the buffer 70 is connectable via a switch 100 controlled by the first clock signal ck1 to the reference line 76.

The capacitors 71 to 75 have values C, C, 2C, 4C and 8C, respectively. For a 4 bit conversion, the output signals vd'(0) to vd'(3) are identical to the four LSBs vd(0) to vd(3), respectively, ie: the LSB shifter 3a does not perform any bit shifting function. The clock signals ck1 and ck2 comprise two-phase non-overlapping clock signals and control the D/A conversion as follows.

When the first clock signal ck1 is active, the switches 78, 80, 82, 84 and 100 are closed so that the capacitors 71 to 75 are discharged. When the second clock signal ck2 is active, the second terminals of the capacitors 72 to 75 are connected to the line 76 to receive the value vl or to the line 99 to receive the value vh according to the logic state of the bits supplied by the shifter 3a. For instance, when the bit vd'(0) is at logic level 0, the switch 91 is open whereas the switch 77 is closed so that the second terminal of the capacitor 72 is connected to the line 76. Conversely, when the bit vd'(0) is at logic level 1, the switch 77 is open and the switch 91 is closed so that the second terminal of the capacitor 72 is connected to the line 99.

The output va of the D/A converter 3b is valid when the second clock signal ck2 is active. The resulting situation can be described by equating the charge in the ones of the capacitors 71 to 75 connected to receive vh (collectively, denoted as capacitance $C_{vh}$ in the following equations) to the charge in those capacitors which are connected to receive vl because both such groups of capacitors are connected to the same node, which is the non-inverting input of the unity gain buffer 70. Thus:

$$C_{vh}(vh-va)=(16C-C_{vh})(va-vl)$$

$$va=vl+C_{vh}(vh-vl)/16C$$

Linear D/A conversion is thus performed between the limit values vl and vh.

The terminating capacitor 71 is provided to ensure that charge is shared between the correct total capacitance of 16C.

Figure 12:
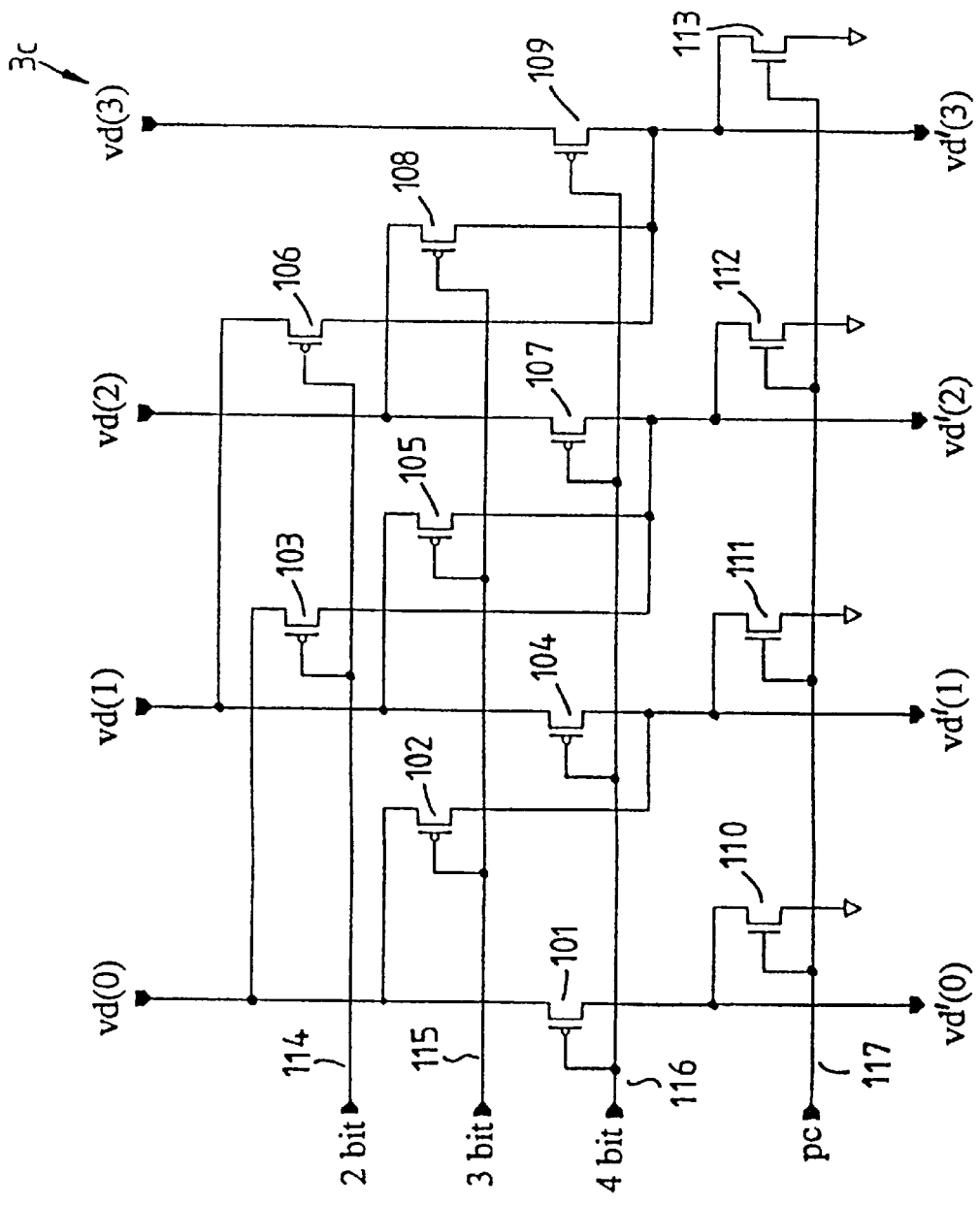
FIG. 12 is a circuit diagram of a four bit shifting circuit of the converter of FIG. 9.

The bit shifter 3a is shown in more detail in FIG. 12. When the converter 3b is required to perform conversions with resolution of less than 4 bits, the bit shifter ensures that the most significant bit of the least significant bit group is supplied to the converter 3b as the most significant bit. For example, if the 4 bit converter 3b is required to perform a 2 bit conversion, then the bit vd(1) must be used to set the 8C capacitor 75 and so must be shifted to the vd'(3) position.

The bit shifter comprises P-type MOSFETs 101 to 109 and N-type MOSFETs 110 to 113. The transistors 101, 104, 107 and 109 are connected in series between the bit inputs vd(0) to vd(3) and the bit outputs vd'(0) to vd'(3), respectively. The transistors 110 to 113 are connected between the bit outputs vd'(0) to vd'(3), respectively, and ground. The transistor 102 is connected between the bit input vd(0) and the bit output vd'(1). The transistor 103 is connected between the bit input vd(0) and the bit output vd'(2). The transistors 105 and 106 are connected between the bit input vd(1) and the bit outputs vd'(2) and vd'(3), respectively. The transistor 108 is connected between the bit input vd(2) and the bit output vd'(3).

The gates of the transistors 103 and 106 are connected to the 2 bit resolution select line 114. The gates of the transistors 102, 105 and 108 are connected to the 3 bit resolution select line 115. The gates of the transistors 101, 104, 107 and 109 are connected to the 4 bit resolution select line 116. The gates of the transistors 110 to 113 are connected to a line 117 for receiving the pre-clock signal pc.

The resolution select control signals are active when at a logic low level (requiring logical inversion from the outputs 2g shown in FIG. 10). Prior to operation, the signal pc causes the transistors 110 to 113 to discharge the bit outputs vd'(0) to vd'(3). When the 4 bit select line 116 is active, the transistors 101, 104, 107 and 109 are conductive whereas the remaining transistors are non-conductive. The bit inputs vd(0) to vd(3) are therefore connected to the bit outputs vd'(0) to vd'(3), respectively. Thus, no bit shifting takes place.

When the 3 bit select line 115 is active, the transistors 102, 105 and 108 are conductive whereas the other transistors are non-conductive. Thus, the bit inputs vd(0) to vd(2) are shifted to the outputs vd'(1) to vd'(3), respectively, resulting in a 1 bit shift.

When the 2 bit select line 114 is active, the transistors 103 and 106 are conductive whereas the remaining transistors are non-conductive. The bit inputs vd(0) and vd(1) are therefore connected to the bit outputs vd'(2) and vd'(3), respectively, resulting in a 2 bit shift.

The decoding arrangement shown in FIG. 10 is fixed and, in combination with the gamma correction reference voltages, determines the piecewise linear approximation. This limits the non-linear functions which may be approximated in that the linear segment end-points can be chosen by selecting appropriate correction voltages but the width of the individual linear elements with respect to the input domain are fixed by the fixed decoding logic of the decoder 2a.

Figure 4A:
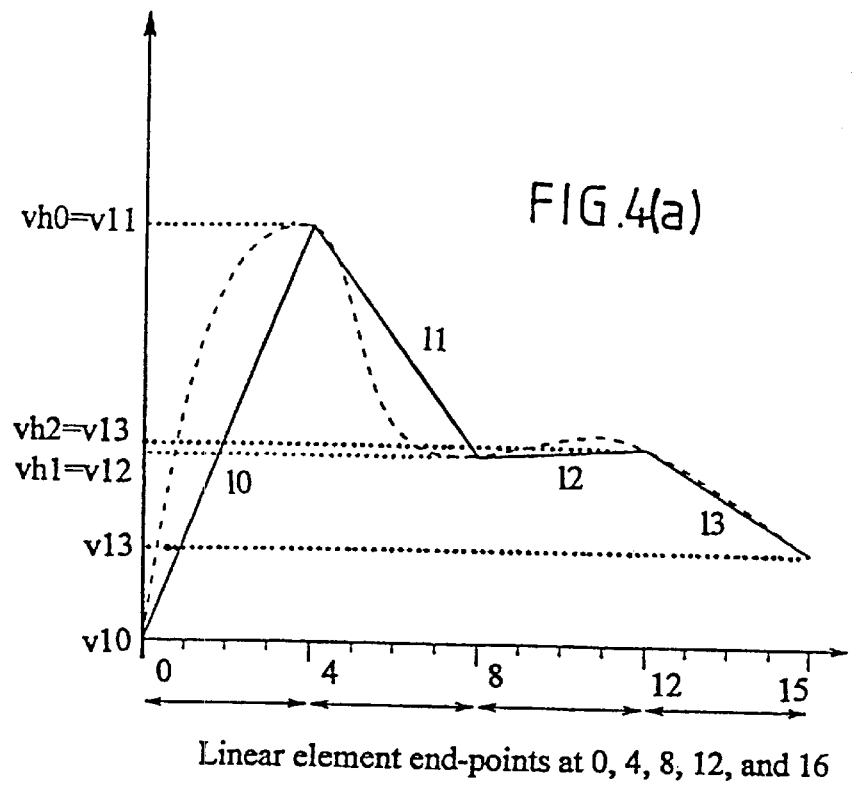
FIG. 4(a) is a graph illustrating an arbitrary non-linear function and a piecewise approximation comprising four linear elements arranged such that five references are required.
Figure 4B:
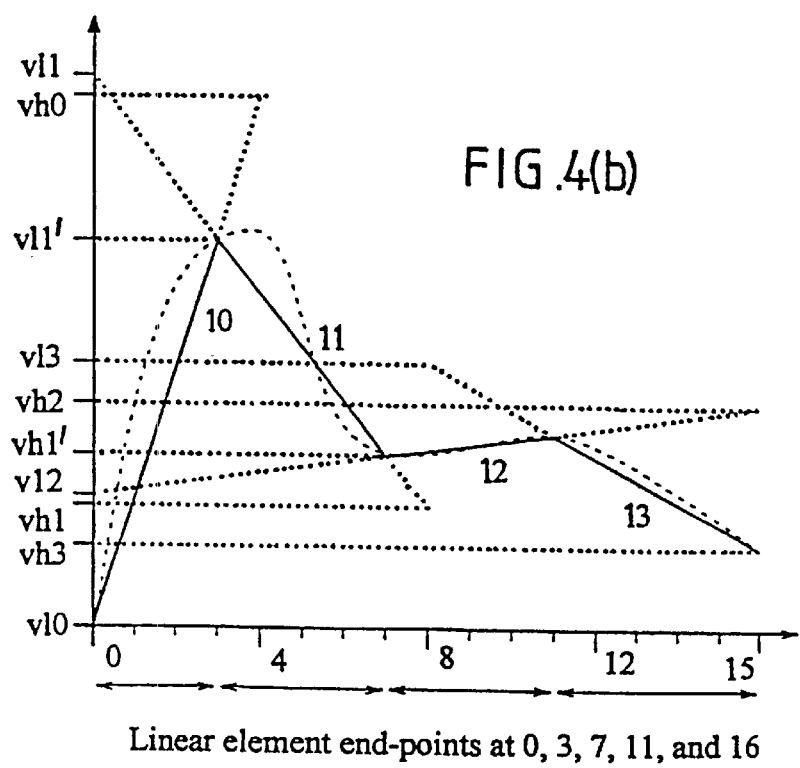
FIG. 4(b) illustrates the non-linear function of FIG. 4(a) and a more accurate piecewise linear approximation using four linear elements but requiring eight references.
Figure 13:
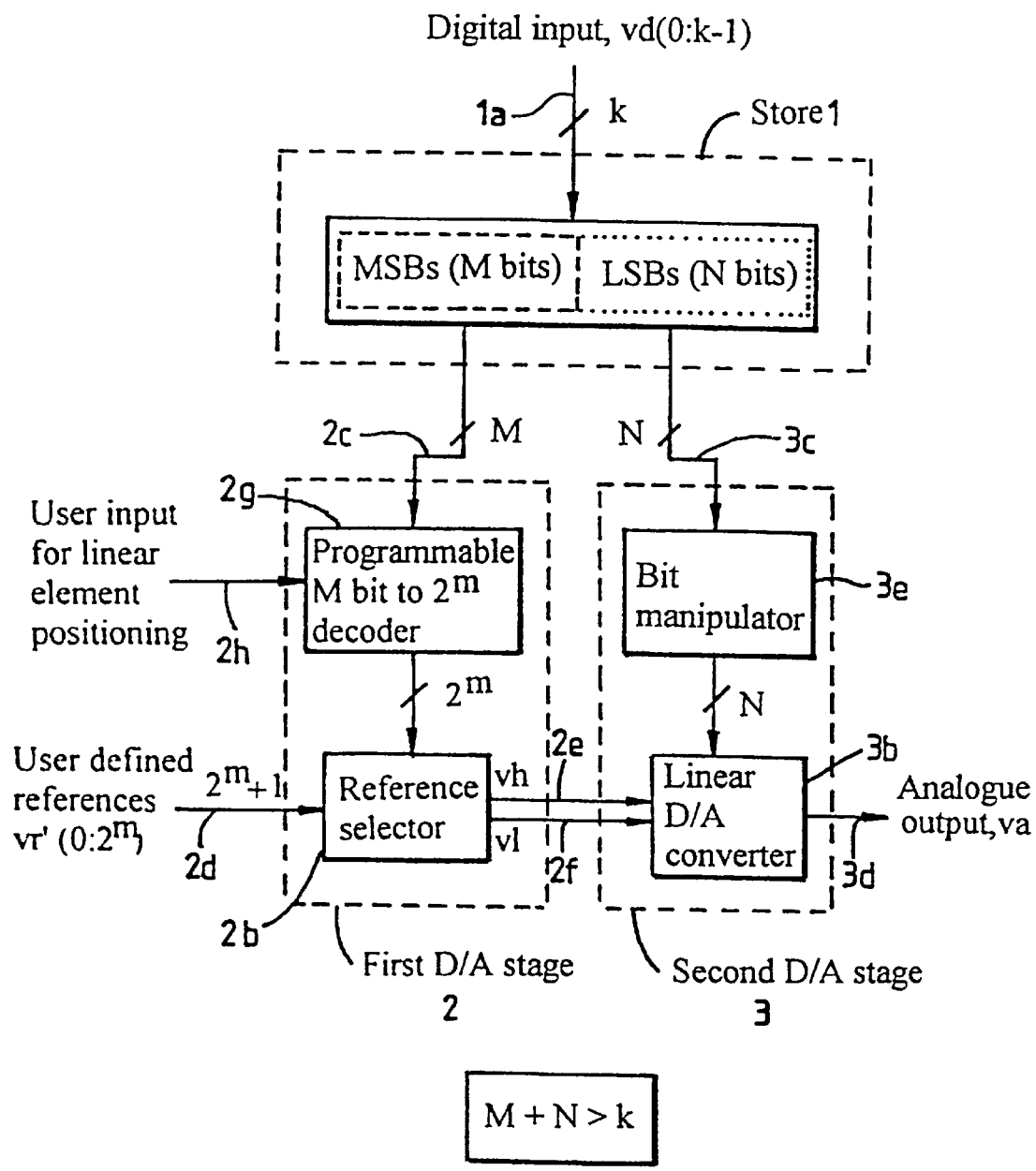
FIG. 13 is a block schematic diagram of a two-stage multi-resolution non-linear D/A converter constituting a third embodiment of the invention.

The converter shown in FIG. 13 differs from that shown in FIG. 7 in that the fixed decoder 2a is replaced by a programmable M bit to $2^m$ decoder 2g having a programming input 2h to allow the linear elements to be positioned as required. Thus, the widths of the line elements can be set arbitrarily (within the constraint that each line element has a width in the input domain of a power of 2). Such an adaptable arrangement therefore allows a non-linear D/A converter to approximate any non-linear function by programming the decoder and selecting the reference voltages. Thus, the converter is not limited to providing gamma correction but has general use in approximating non-linear functions. Also, although the non-linear functions used as examples in FIGS. 6 and 8 are monotonic, the converter may be used to approximate non-monotonic functions, such as that illustrated in FIGS. 4(a) and 4(b).

Figure 14:
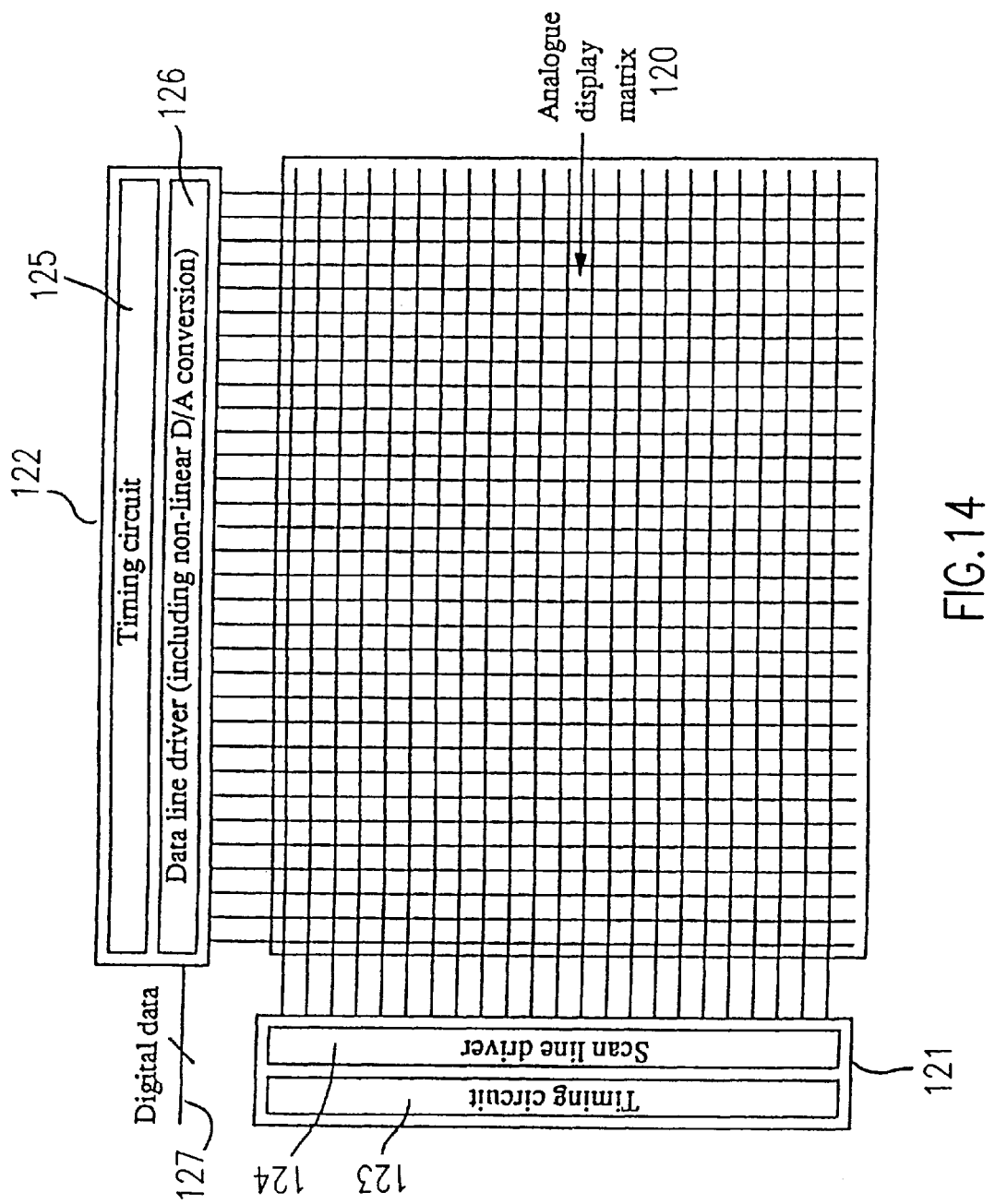
FIG. 14 is a schematic diagram of a display including a plurality of non-linear D/A converters of any of the types shown in FIGS. 5, 7, 9 and 13.

FIG. 14 illustrates a digitally interface display comprising an analogue display matrix 120 of picture elements (pixels) arranged as rows and columns. The pixels of each row are connected to a common row or scan electrode which is connected to a scan signal generator 121. The pixels of each column are connected to a common column or data electrode which is connected to a data signal generator 122.

The scan signal generator comprises a timing circuit 123 and a scan line driver 124. The timing circuit 123 typically supplies via the scan line driver 124 a scan signal to each of the scan electrodes in turn so that the pixels of the matrix 120 are updated or refreshed a row at a time.

The data signal generator 122 comprises a timing circuit 125 and a data line driver 126 connected to receive digital image data from an input 127. The timing circuit 122 typically times the operation of the data signal generator so that each row or line of digital video data is entered and then supplied via the data line drivers 126 simultaneously to the data electrodes. The data line driver 126 comprises a non-linear D/A converter for each of the data electrodes. The converter converts the digital image data for the pixel to be updated or refreshed and converts this to a corresponding analogue quantity, such as voltage, for supplying to the corresponding pixel column of the matrix 120. Each of the D/A converters of the driver 126 is of any of the types described hereinbefore as embodiments of the invention and illustrated in the drawings.

The analogue display matrix 120 maybe embodied in any desired technology. For instance, the matrix 120 may comprise a pixelated liquid crystal device and may be of the active matrix type. The non-linear D/A conversion performed by the converters of the driver 126 may be arranged to provide gamma correction so as to compensate for the non-linearity of the optically tenuation versus pixel voltage characteristic of liquid crystal modes capable of providing analogue grey scale.

What is claimed is:

1. A non-linear digital-to-analog converter, comprising:
   a k bit parallel input;
   a decoding circuit having M inputs connected to M most significant bits of the parallel input, the decoding circuit being arranged to connect first and second consecutive reference inputs among $2^m+1$ reference inputs to first and second outputs, respectively, where M>m; and
   a variable resolution linear digital-to-analog converter having first and second reference inputs connected to the first and second outputs of the decoding circuit, respectively, and further having N digital inputs connected to N least significant bits of the parallel input, where (M+N)>k.

2. A converter according to claim 1, wherein (M+N)>(k+1).

3. A converter according to claim 1, wherein the decoding circuit comprises a fixed M-bit-to-$2^m$-line decoder.

4. A converter according to claim 1, wherein the decoding circuit comprises a programmable M-bit-to-$2^m$-line decoder.

5. A converter according to claim 1, wherein the decoding circuit comprises a reference input selector.

6. A converter according to claim 5, wherein the reference input selector comprises first and second selectors for connecting i-th and (i+1)-th reference inputs among the $2^m+1$ reference inputs, as the first and second consecutive reference inputs, to the first and second outputs of the decoding circuit, respectively, where $0 \leq i < 2^m$.

7. A converter according to claim 1, wherein the variable resolution converter comprises a fixed resolution N bit converter and a least significant bit sifter controlled by the decoding circuit.

8. A converter according to claim 7, wherein the fixed resolution N bit converter comprises a charge-sharing digital-to-analog converter.

9. A converter according to claim 1, wherein the variable resolution converter comprises a fixed resolution N bit converter and a bit manipulator.

10. A converter according to claim 9, wherein the fixed resolution N bit converter comprises a charge-sharing digital-to-analog converter.

11. A converter according to claim 1, wherein the parallel input comprises a latch.

12. A display comprising:
    a display matrix including a plurality of pixels arranged as rows and columns;
    a plurality of scan electrodes connecting the pixels with a scan signal generator; and
    a plurality of data electrodes connecting the pixels with a data signal generator,
       wherein the data signal generator includes a data line driver which includes at least one non-linear digital-to-analog converter, and
       said at least one non-linear digital-to-analog converter is the one according to claim 1.

* * * * *